(12) United States Patent
Takata (10) Patent No.: US 11,323,098 B2
(45) Date of Patent: *May 3, 2022

(54) DUPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 84 days.

This patent is subject to a terminal disclaimer.

(21) Appl. No.: 16/855,240

(22) Filed: Apr. 22, 2020

(65) Prior Publication Data

US 2020/0252054 A1 Aug. 6, 2020

Related U.S. Application Data

(63) Continuation of application No. 15/719,645, filed on Sep. 29, 2017, now Pat. No. 10,666,229, and a (Continued)

(30) Foreign Application Priority Data

Apr. 1, 2015 (JP) .............................. JP2015-075188

(51) Int. Cl.
*H03H 9/72* (2006.01)
*H03H 9/64* (2006.01)
(Continued)

(52) U.S. Cl.
CPC .......... *H03H 9/725* (2013.01); *H03H 9/6483* (2013.01); *H04B 1/48* (2013.01); *H04L 5/1461* (2013.01)

(58) Field of Classification Search
CPC ...... H04B 1/0475; H04B 1/0458; H04B 1/48; H04B 1/52; H04B 2001/0408;
(Continued)

(56) References Cited

U.S. PATENT DOCUMENTS 6,525,624 B1 * 2/2003 Hikita .................. H03H 7/0161
333/133
7,084,718 B2 * 8/2006 Nakamura ......... H03H 9/02118
333/133
(Continued)

FOREIGN PATENT DOCUMENTS

WO 2014/168162 A1 10/2014

OTHER PUBLICATIONS

Tanaka, "Duplexer", U.S. Appl. No. 15/719,645, filed Sep. 29, 2017.

*Primary Examiner* — Eric Nowlin
(74) *Attorney, Agent, or Firm* — Keating & Bennett, LLP (57) ABSTRACT

A duplexer includes elastic wave resonators disposed on a piezoelectric substrate to define a ladder elastic wave filter including shunt-arm resonators and series-arm resonators. The duplexer includes an inductance component connected between an antenna terminal and a ground potential. A transmitting filter includes the ladder elastic wave filter. The inductance component is disposed outside a short side of the piezoelectric substrate such that the electromagnetic coupling between the shunt-arm resonator located closest to a transmitting terminal in the ladder circuit configuration, and the inductance component is stronger than the electromagnetic coupling between the inductance component and the remaining shunt-arm resonators.

10 Claims, 9 Drawing Sheets

Related U.S. Application Data continuation of application No. PCT/JP2016/055224, filed on Feb. 23, 2016.

(51) Int. Cl.
  *H04B 1/48* (2006.01)
  *H04L 5/14* (2006.01)

(58) Field of Classification Search
  CPC ............ H04B 2001/485; H04L 5/1461; H03H 9/6483; H03H 9/725
  See application file for complete search history.

(56) References Cited

U.S. PATENT DOCUMENTS

| | | | | |
|---|---|---|---|---|
| 7,095,298 B2* | 8/2006 | Song | ................ | H03H 3/02 |
| | | | | 333/187 |
| 7,619,491 B2* | 11/2009 | Takata | ................ | H03H 9/0576 |
| | | | | 333/133 |
| 8,183,958 B2* | 5/2012 | Fujita | ................ | H03H 9/6483 |
| | | | | 333/133 |
| 8,456,254 B2* | 6/2013 | Taniguchi | ............ | H03H 9/6483 |
| | | | | 333/133 |
| 8,717,113 B2* | 5/2014 | Iizuka | ................ | H03B 5/1212 |
| | | | | 331/167 |
| 9,344,034 B2* | 5/2016 | Iizuka | ................ | H03B 1/00 |
| 10,236,861 B2* | 3/2019 | Takata | ................ | H03H 9/725 |
| 10,666,229 B2* | 5/2020 | Takata | ................ | H03H 9/6483 |
| 2004/0119562 A1* | 6/2004 | Sakano | ................ | H04B 1/525 |
| | | | | 333/133 |
| 2005/0012571 A1* | 1/2005 | Song | ................ | H03H 9/172 |
| | | | | 333/192 |
| 2005/0099244 A1* | 5/2005 | Nakamura | ............ | H03H 9/564 |
| | | | | 333/133 |
| 2009/0058555 A1* | 3/2009 | Takata | ................ | H03H 9/725 |
| | | | | 333/129 |
| 2009/0058557 A1* | 3/2009 | Tsurunari | ............... | H03H 9/725 |
| | | | | 333/133 |
| 2009/0256649 A1* | 10/2009 | Taniguchi | ............ | H03H 9/6483 |
| | | | | 333/186 |
| 2012/0182088 A1* | 7/2012 | Inoue | ................ | H03H 9/706 |
| | | | | 333/133 |
| 2012/0200364 A1* | 8/2012 | Iizuka | ................ | H03L 1/026 |
| | | | | 331/117 FE |
| 2012/0306593 A1* | 12/2012 | Kidoh | ................ | H03H 9/0576 |
| | | | | 333/186 |
| 2013/0328640 A1* | 12/2013 | Tsutsumi | ............... | H03H 9/706 |
| | | | | 333/133 |
| 2014/0203882 A1* | 7/2014 | Iizuka | ................ | H03B 1/00 |
| | | | | 331/117 FE |
| 2016/0028364 A1 | 1/2016 | Takeuchi | | |
| 2018/0013405 A1* | 1/2018 | Takata | ................ | H03H 9/6423 |

* cited by examiner

DUPLEXER

CROSS REFERENCE TO RELATED APPLICATIONS

This application claims the benefit of priority to Japanese Patent Application No. 2015-075188 filed on Apr. 1, 2015 and is a Continuation Application of PCT Application No. PCT/JP2016/055224 filed on Feb. 23, 2016. The entire contents of each application are hereby incorporated herein by reference.

BACKGROUND OF THE INVENTION

1. Field of the Invention

The present invention relates to a duplexer including a transmitting filter and a receiving filter, and in particular, to a duplexer including a transmitting filter that includes a ladder elastic wave filter.

2. Description of the Related Art

Duplexers with a ladder elastic wave filter have been widely used in applications, such as cellular phones. For example, WO2010/013778A1 discloses an example of this type of duplexer. The duplexer described in WO2010/013778A1 includes a transmitting filter and a receiving filter that are connected to an antenna terminal. The transmitting filter is formed by a ladder elastic wave filter including a plurality of elastic wave resonators. An electromagnetic coupling device for electromagnetic coupling with the antenna terminal is provided between a shunt-arm resonator of the ladder elastic wave filter and a ground terminal. The electromagnetic coupling device includes a plurality of coiled patterns connected to each other by a via-hole electrode.

In WO2010/013778A1, the electromagnetic coupling device includes a plurality of coiled patterns connected to each other by a via-hole electrode. Thus, a large space needs to be provided in the piezoelectric substrate to form the electromagnetic coupling device. This makes miniaturization difficult.

SUMMARY OF THE INVENTION

Preferred embodiments of the present invention provide duplexers that are able to be miniaturized and provide improved isolation.

A duplexer according to a preferred embodiment of the present invention includes a module substrate, an antenna terminal provided on the module substrate, a transmitting terminal provided on the module substrate, a receiving terminal provided on the module substrate, a transmitting filter connected between the antenna terminal and the transmitting terminal and including at least one elastic wave filter including a piezoelectric substrate that is mounted on the module substrate, a receiving filter connected between the antenna terminal and the receiving terminal, and an inductance component connected at one end to the antenna terminal, and connected at another end to a ground potential. The inductance component is disposed outside the piezoelectric substrate and is mounted on the module substrate.

In a duplexer according to another preferred embodiment of the present invention, the inductance component is disposed outside one side of the piezoelectric substrate, such that a longitudinal direction of the inductance component extends parallel or substantially parallel to the one side. In this case, the resulting electromagnetic coupling effectively improves isolation in the pass band of the receiving filter.

In a duplexer according to another preferred embodiment of the present invention, the inductance component includes a coil winding with an axial direction perpendicular or substantially perpendicular to a mounting surface of the inductance component. In this case, electromagnetic coupling is improved, thus further improving the isolation characteristics in the pass band of the receiving filter.

In a duplexer according to another preferred embodiment of the present invention, the receiving filter is provided on the piezoelectric substrate, and the piezoelectric substrate defines a duplexer chip. In this case, further miniaturization is achieved.

In a duplexer according to another preferred embodiment of the present invention, the module substrate is a multilayer substrate.

In a duplexer according to another preferred embodiment of the present invention, the piezoelectric substrate has a rectangular or substantially rectangular shape including a pair of short sides and a pair of long sides. The transmitting filter is positioned closer to a first short side of the pair of short sides than to a second short side of the pair of short sides. The receiving filter is positioned adjacent to or near the second short side.

In a duplexer according to another preferred embodiment of the present invention, the inductance component is a chip coil component.

In a duplexer according to another preferred embodiment of the present invention, the transmitting filter includes a plurality of series-arm resonators.

In a duplexer according to another preferred embodiment of the present invention, the antenna terminal is located in a middle portion of a first long side of the pair of long sides of the piezoelectric substrate. The transmitting terminal is positioned near a corner portion of the piezoelectric substrate between a second long side of the pair of long sides and the first short side. The receiving terminal is located near a corner portion of the piezoelectric substrate between the second long side and the second short side.

In a duplexer according to another preferred embodiment of the present invention, the one side of the piezoelectric substrate extends in a direction parallel or substantially parallel to a direction of propagation of an elastic wave in a transmitting-side shunt-arm resonator of the transmitting filter.

In the duplexers according to various preferred embodiments of the present invention, the inductance component is disposed outside one side of the piezoelectric substrate adjacent to which the transmitting-side shunt-arm resonator is positioned, such that the inductance component extends parallel or substantially parallel to the one side. This configuration enables miniaturization of the duplexer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be explained based on the following description of specific preferred embodiments of the present invention made with reference to the drawings.

It is to be noted that the preferred embodiments described herein are intended to be illustrative, and among different preferred embodiments, some of their features may be substituted for or combined with each other.

Figure 1:
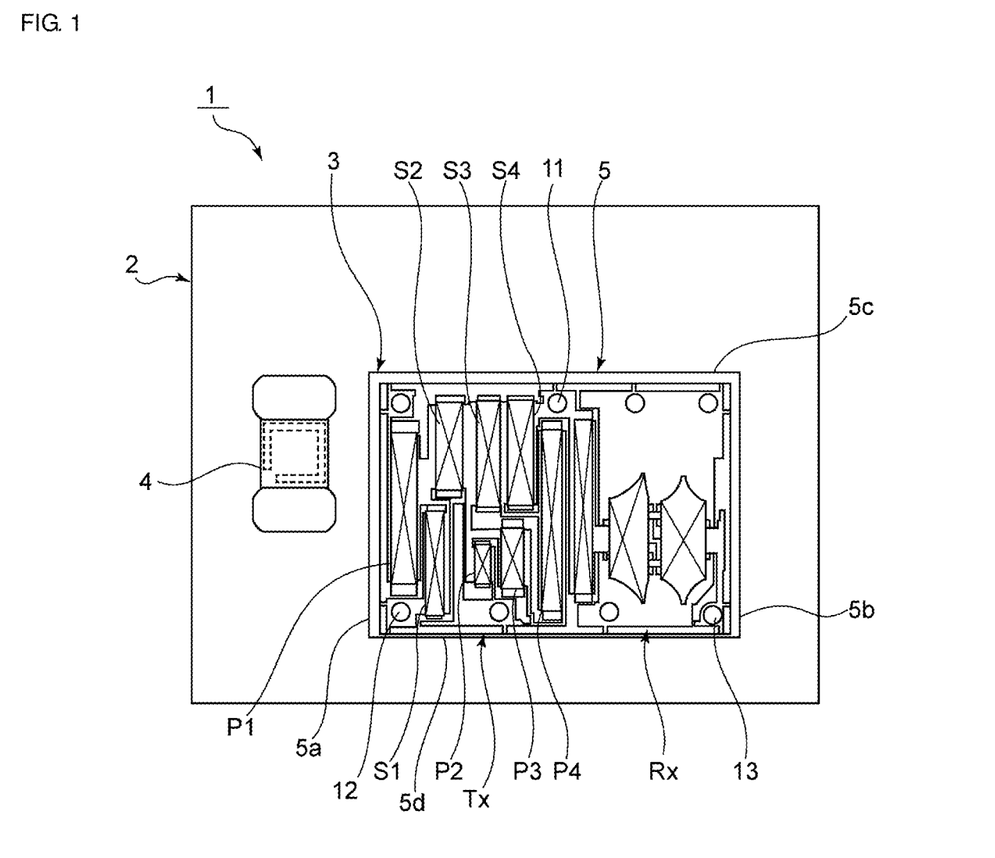
FIG. 1 is a plan view of a duplexer according to a first preferred embodiment of the present invention.

FIG. 1 is a plan view of a duplexer according to a first preferred embodiment of the present invention. A duplexer 1 includes a module substrate 2. A duplexer chip 3 is mounted on the module substrate 2. An inductance component 4 is mounted on the module substrate 2. The inductance component 4, which is preferably defined by a chip-type coil component, has a longitudinal direction.

The duplexer chip 3 includes a piezoelectric substrate 5. A transmitting filter Tx and a receiving filter Rx are provided on the piezoelectric substrate 5.

More specifically, the piezoelectric substrate 5 is preferably made of piezoelectric monocrystal, such as $LiTaO_3$ or $LiNbO_3$, for example.

The electrode structure illustrated in FIG. 1 is provided on the piezoelectric substrate 5 to define the transmitting filter Tx and the receiving filter Rx. The piezoelectric substrate 5 preferably has a rectangular or substantially rectangular shape, for example, including a pair of short sides 5a and 5b and a pair of long sides 5c and 5d. The transmitting filter Tx is positioned close to the short side 5a. The receiving filter Rx is positioned close to the short side 5b.

Figure 2:
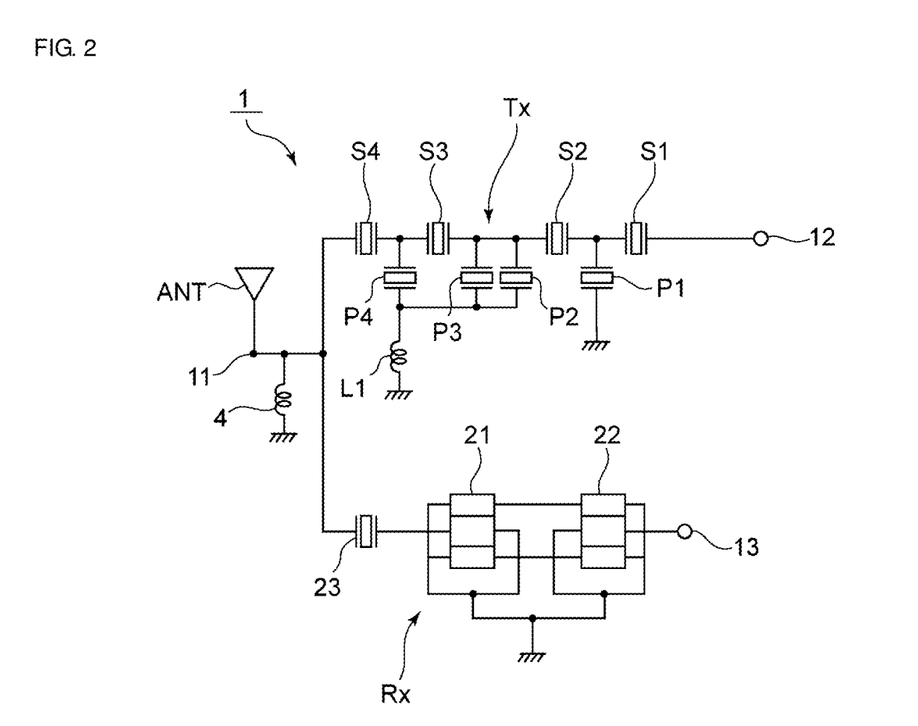
FIG. 2 is a circuit diagram of the duplexer according to the first preferred embodiment of the present invention.

The configurations of the transmitting filter Tx and the receiving filter Rx will be described below with reference to the circuit diagram of FIG. 2.

The duplexer 1 includes an antenna terminal 11, a transmitting terminal 12, and a receiving terminal 13. The antenna terminal 11 is connected to an antenna ANT located outside the duplexer 1.

The inductance component 4 to perform impedance matching is connected between the antenna terminal 11 and the ground potential. The transmitting filter Tx is connected between the antenna terminal 11 and the transmitting terminal 12.

The transmitting filter Tx, which has a ladder circuit configuration, includes a plurality of series-arm resonators S1 to S4, and a plurality of shunt-arm resonators P1 to P4. The series-arm resonator S1, the series-arm resonator S2, the series-arm resonator S3, and the series-arm resonator S4 are connected in order of decreasing proximity to the transmitting terminal 12. Of the shunt-arm resonators P1 to P4, the shunt-arm resonator in the shunt arm located closest to the transmitting terminal 12 will be hereinafter referred to as the transmitting-side shunt-arm resonator P1 as appropriate.

The series-arm resonators S1 to S4 and the shunt-arm resonators P1 to P4 are both defined by surface acoustic wave resonators. More specifically, each single elastic wave resonator includes an interdigital transducer (IDT) electrode disposed on the piezoelectric substrate 5 and including an oblong shape, with reflectors located on both sides of the IDT electrode with respect to the direction of elastic wave propagation. In FIG. 1, an "X" enclosed by a rectangular box is used to schematically represent an area where an elastic wave resonator is provided. As illustrated in FIG. 1, the long side 5c is the side least distant from the antenna terminal 11. The antenna terminal 11 is positioned in the middle portion of the long side 5c. The transmitting terminal 12 is located near the corner portion between the long side 5d located opposite the long side 5c, and the short side 5a connecting the long side 5c and the long side 5d. The receiving terminal 13 is located near the corner portion between the long side 5d, and the short side 5b located opposite the short side 5a. In other words, the transmitting terminal 12 is positioned at the same side as the long side 5d and close to the short side 5a, and the receiving terminal 13 is positioned at the same side as the long side 5d and close to the short side 5b.

Returning now to FIG. 2, the transmitting-side shunt-arm resonator P1 is connected to the ground potential. That is, no inductor is connected between the transmitting-side shunt-arm resonator P1 and the ground potential. An inductor L1 is connected between the ground potential-side end portion of each of the shunt-arm resonators P2 to P4, and the ground potential. The inductor L1 is provided to adjust the frequency characteristics of an attenuation pole created at a harmonic frequency of the transmitting filter Tx.

The inductor L1 may preferably be defined by providing an inductance element on the piezoelectric substrate 5 by wiring or other methods, for example. Alternatively, the inductor L1 may be provided on the module substrate 2, outside the piezoelectric substrate 5. Further, the inductor L1 may be provided by mounting an external inductance component onto the module substrate 2.

An inductor may be provided between the ground potential-side end portion of the transmitting-side shunt-arm resonator P1, and the ground potential.

Characteristic features of the duplexer 1 according to the first preferred embodiment include that the inductance component 4 for impedance matching is disposed so as to be electromagnetically coupled to the transmitting-side shunt-arm resonator P1, and that the inductance component 4 is defined by an inductance component that is externally added to the duplexer chip 3.

The duplexer 1 uses the inductance component 4, and thus, a large area is not required for the duplexer chip 3 and the module substrate 2. In the duplexer described in WO2010/013778A1, a plurality of coiled patterns are provided within the module substrate, and connected by a via-hole electrode to provide an inductance. This configuration inevitably leads to an increase in the area of the module substrate. Further, a large inductance value is required to achieve electromagnetic coupling.

In contrast, in the first preferred embodiment, no coiled wiring pattern with a large area needs to be provided within the module substrate 2, which preferably has a multi-layer construction including components, such as wiring, via-conductors, and ground electrodes, for example. This enables the area of the module substrate 2 to be reduced. The duplexer 1 thus enables effective miniaturization. Even if the inductor L1 defined by a coiled wiring pattern is provided within the module substrate 2 with a multi-layer structure to adjust the frequency characteristics of an attenuation pole generated at a harmonic frequency of the transmitting filter Tx, electromagnetic coupling is utilized such that a small inductance value is sufficient to adjust the frequency characteristics of a attenuation pole at a harmonic frequency. As a result, the frequency characteristics of an attenuation pole at a harmonic frequency are able to be adjusted without increasing the physical size of the module substrate 2.

The inductance component 4, which is preferably a chip component with a rectangular or substantially rectangular parallelepiped shape, is disposed with its longitudinal direction parallel or substantially parallel to the direction in which the short side 5a extends. If the inductance component 4 is disposed with its transverse direction parallel or substantially parallel to the direction in which the short side 5a extends, the mounting electrode (outer electrode) of the inductance component which has electrical conductivity is disposed opposite the short side 5a. This means that the mounting electrode is located between the inductor included in the inductance component 4, and the transmitting-side shunt-arm resonator P1, which makes it more difficult for electromagnetic coupling to occur.

The absence of another electronic component between the inductance component 4 and the short side 5a also enables miniaturization.

One end of the inductance component 4 is connected to the antenna terminal 11 by wiring (not illustrated). The inductance component 4 is located near the short side 5a of the piezoelectric substrate 5. The short side 5a is the side of the piezoelectric substrate 5 that is the least distant from the transmitting-side shunt-arm resonator P1. More specifically, the transmitting filter Tx includes the shunt-arm resonators P1 to P4, and the series-arm resonators S1 to S4. Of these resonators, the transmitting-side shunt-arm resonator P1 and the short side 5a are spaced apart from each other a distance that is shorter than the distance between each of the remaining resonators, such as the series-arm resonators S1 to S4 and the shunt-arm resonators P2 to P4, and the short side 5a. Therefore, disposing the inductance component 4 outside the short side 5a makes it possible to effectively improve the electromagnetic coupling between the inductance component 4 and the capacitance of the transmitting-side shunt-arm resonator P1. This configuration of the duplexer makes it possible to effectively improve the isolation characteristics of the transmitting filter Tx in the pass band of the receiving filter Rx. This will be described in more detail later with reference to specific experimental examples.

The distance between the transmitting-side shunt-arm resonator P1 and the transmitting terminal 12 is shorter than the distance between the series-arm resonator S4, which is the least distant from the antenna terminal 11, and the transmitting terminal 12. This configuration also enables the above-mentioned electromagnetic coupling to be effectively improved.

The short side 5a is a side different from the long side 5c located near the antenna terminal 11. This ensures increased freedom of design with respect to the relative positioning of the antenna terminal 11 and the inductance component 4. It is to be noted, however, that the inductance component 4 may be positioned adjacent to the same side as the side to which the antenna terminal 11 is positioned adjacent.

Alternatively, the inductance component 4 may be positioned adjacent to the long side 5d located opposite the long side 5c. That is, there are no particular limitations as to the side of the piezoelectric substrate 5 to which the inductance component 4 is to be positioned adjacent, as long as the inductance component 4 is positioned adjacent to the transmitting-side shunt-arm resonator P1.

In the first preferred embodiment, the axial direction of the coil winding of the inductance component 4 is preferably perpendicular or substantially perpendicular to the mounting surface of the inductance component. As a result, as viewed in the axial direction of the coil winding, the central cavity of the coil included in the inductance component 4 has a relatively large inside diameter in the longitudinal direction of the inductance component 4, and a relatively small inside diameter in the transverse direction of the inductance component 4. This results in an elongated shape in the longitudinal direction of the inductance component 4 as viewed in the axial direction of the coil winding. The longitudinal direction of the inductance component 4 is preferably parallel or substantially parallel to the direction of propagation of the surface acoustic wave in the transmitting-side shunt-arm resonator P1. This configuration enables a greater portion of the magnetic flux generated from the central cavity of the elongated coil to penetrate the transmitting-side shunt-arm resonator P1 in which the electrode fingers of a comb-shaped electrode are arranged in the direction of propagation of the surface acoustic wave. This improves the electromagnetic coupling between the inductance component 4 and the transmitting-side shunt-arm resonator P1. It is to be noted, however, that the axial direction of the coil winding of the inductance component 4 is not limited to the direction described above.

The receiving filter Rx preferably has a circuit configuration including a cascading connection of 3IDT longitudinally coupled resonator-type surface acoustic wave filters 21 and 22, for example. An elastic wave resonator 23 is connected between the longitudinally coupled resonator-type surface acoustic wave filter 21 and the antenna terminal 11. The receiving filter Rx is not limited to a filter including the longitudinally coupled resonator-type surface acoustic wave filters 21 and 22 described above, but may be defined by a ladder elastic wave filter. Each of the 3IDT longitudinally coupled resonator-type surface acoustic wave filters 21 and 22 may be partially replaced by a 5IDT longitudinally coupled resonator-type surface acoustic wave filter, which is an extension of a 3IDT longitudinally coupled resonator-type surface acoustic wave filter.

Although both of the transmitting filter Tx and the receiving filter Rx are provided on the piezoelectric substrate 5 in the first preferred embodiment, only the transmitting filter Tx may be provided on the piezoelectric substrate 5. That is, the receiving filter Rx may be provided on another piezoelectric substrate, and mounted onto the module substrate 2. Further, the receiving filter Rx may be provided directly on the module substrate 2.

Figure 3:
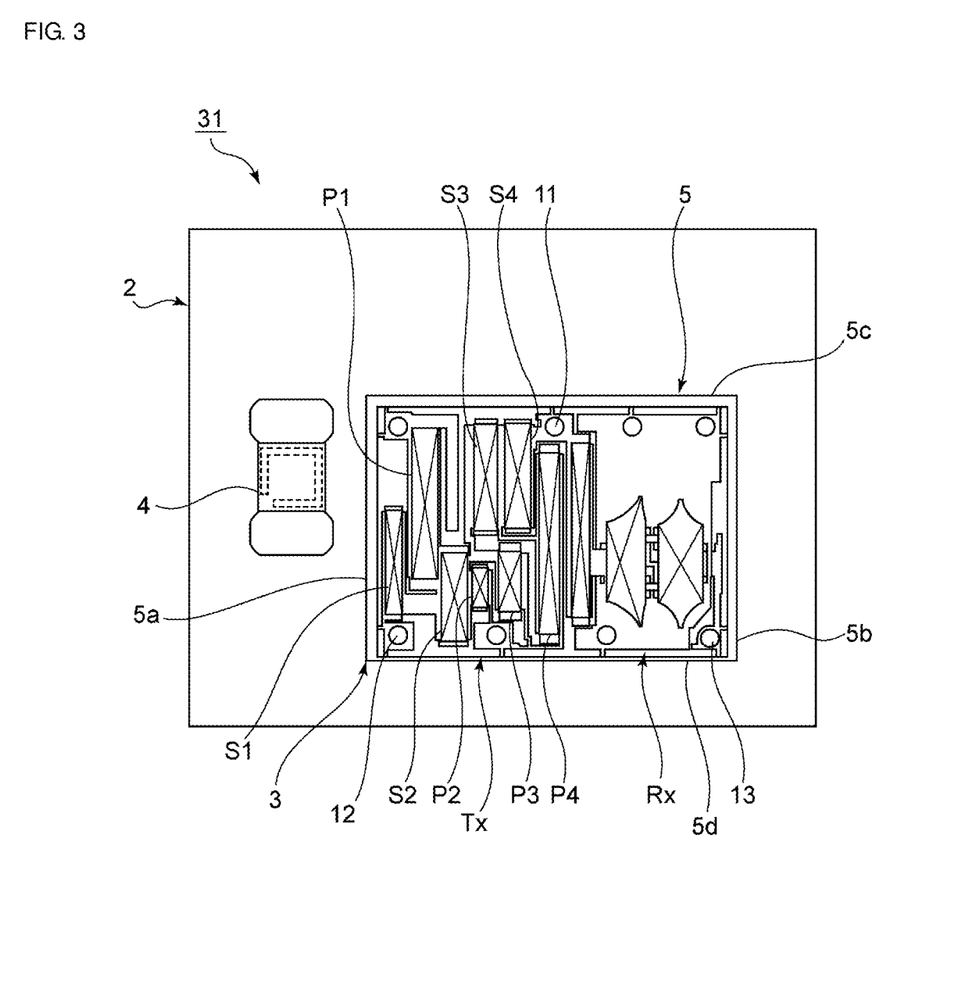
FIG. 3 is a plan view of a duplexer according to a second preferred embodiment of the present invention.

FIG. 3 is a plan view of a duplexer 31 according to a second preferred embodiment of the present invention. In the duplexer 31, the distance between the series-arm resonator S1 and the transmitting terminal 12 is shorter than the distance between the transmitting-side shunt-arm resonator P1 and the transmitting terminal 12. Otherwise, the second preferred embodiment has the same or substantially the same configuration as the first preferred embodiment. As in the duplexer 31, according to the present preferred embodiment, at least one series-arm resonator may be positioned physically closer to the inductance component 4 or the transmitting terminal 12 than is the transmitting-side shunt-arm resonator P1.

Figure 4A:
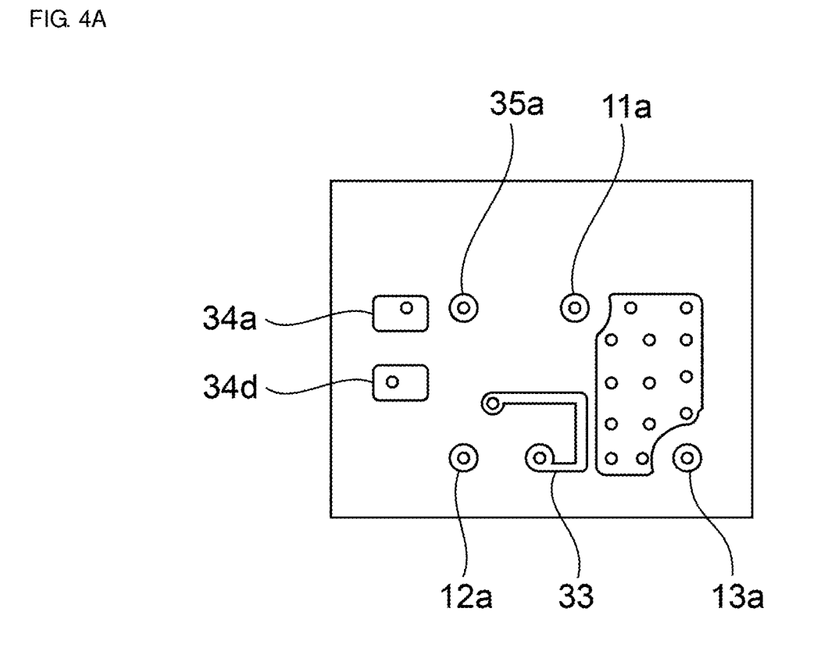
FIGS. 4A and 4B are respectively plan views of the structures of electrodes on the first and second layers under the top surface of the module substrate of the duplexer according to the second preferred embodiment of the present invention.
Figure 4B:
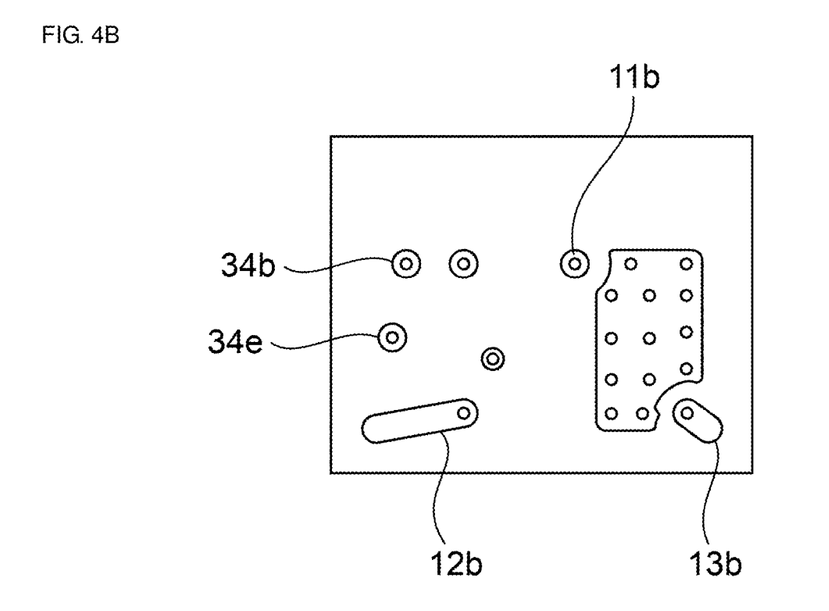
Figure 5A:
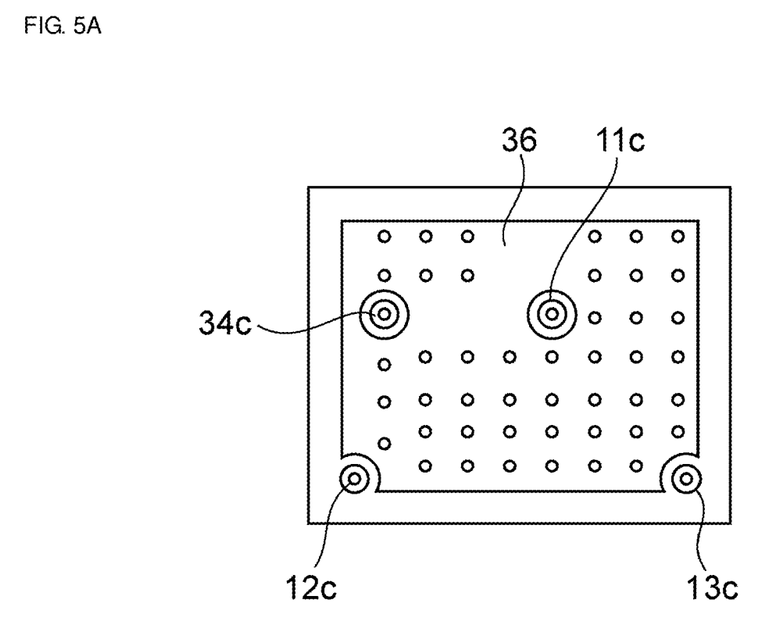
FIGS. 5A and 5B are respectively plan views of the structures of electrodes on the third and fifth layers under the top surface of a module substrate of the duplexer according to the second preferred embodiment of the present invention.
Figure 5B:
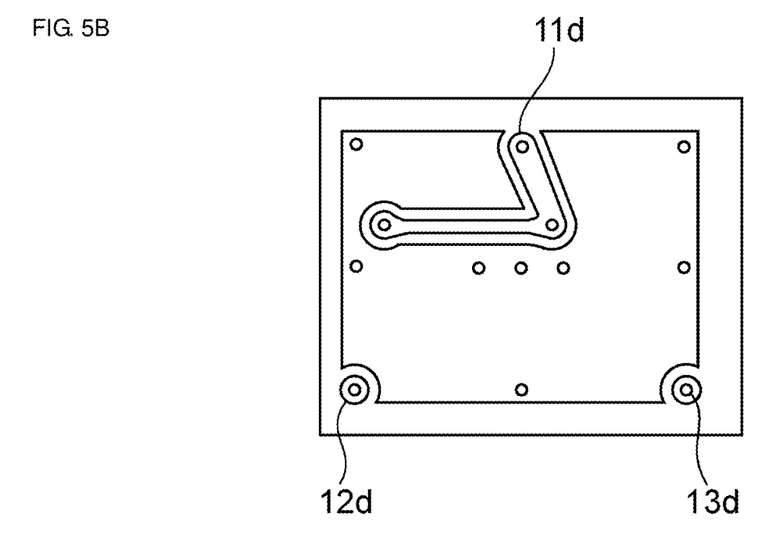
Figure 6:
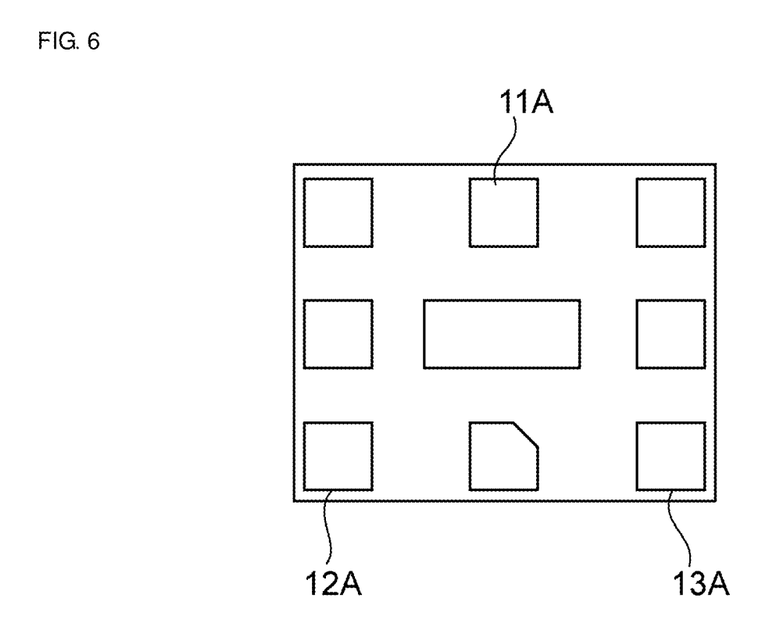
FIG. 6 is a schematic plan view of the structure of electrodes on the undersurface of the module substrate of the duplexer according to the second preferred embodiment of the present invention.

Next, the structure of the electrodes within the module substrate 2 of the duplexer 31 will be described with reference to FIGS. 4A and 4B, FIGS. 5A and 5B, and FIG. 6. FIG. 4A and 4B are respectively schematic plan views of the electrode structures of the first and second layers under the top surface of the module substrate 2. FIG. 5A and 5B are respectively schematic plan views of the electrode structures of the third and fifth layers under the top surface of the module substrate 2. FIG. 6 is a schematic plan view of the electrode structure of the undersurface of the module substrate 2. The electrode structure of the fourth layer is the same or substantially the same as that of the third layer, and thus, will not be described.

As illustrated in FIG. 4A, the first layer under the top surface of the module substrate 2 is provided with an electrode land 11a connected to the antenna terminal 11, an electrode land 35a connected to the ground potential-side end portion of the transmitting-side shunt-arm resonator P1, an electrode land 12a connected to the transmitting terminal 12, and an electrode land 13a connected to the receiving terminal 13. Further, a coiled wiring pattern 33 is provided to define the inductor L1 connected between each of the shunt-arm resonators P2 to P4 and the ground potential. An electrode land 36 connected to the ground potential is disposed below the inductor L1, and the shunt-arm resonators and series-arm resonators of the transmitting filter Tx are disposed above the inductor L1.

The antenna terminal 11 is electrically connected to each of an electrode land 11b illustrated in FIG. 4B, an electrode land 11c illustrated in FIG. 5A, and an electrode land 11d illustrated in FIG. 5B by a via-hole electrode. The electrode land 11d is electrically connected to a terminal electrode 11A illustrated in FIG. 6 by a via-hole electrode.

The transmitting terminal 12 is electrically connected to each of the electrode land 12a illustrated in FIG. 4A, an electrode land 12b illustrated in FIG. 4B, an electrode land 12c illustrated in FIG. 5A, and an electrode land 12d illustrated in FIG. 5B by a via-hole electrode. The electrode land 12d is connected to a terminal electrode 12A illustrated in FIG. 6 by a via-hole electrode.

The inductance component 4 is electrically connected to each of electrode lands 34a and 34d illustrated in FIG. 4A. The electrode land 34a is connected to an electrode land 34b illustrated in FIG. 4B by a via-hole electrode. The electrode land 34b is electrically connected to each of an electrode land 34c illustrated in FIG. 5A, and the electrode land 11d illustrated in FIG. 5B by a via-hole electrode. Thus, one end of the inductance component 4 is electrically connected to the antenna terminal 11.

The electrode land 34d illustrated in FIG. 4A is electrically connected to an electrode land 34e illustrated in FIG. 4B by a via-hole electrode. The electrode land 34e is electrically connected to the electrode land 36 illustrated in FIG. 5A by a via-hole electrode. The electrode land 36 is an electrode land connected to the ground potential.

The receiving terminal 13 is electrically connected to each of the electrode land 13a and an electrode land 13b respectively illustrated in FIGS. 4A and 4B, and an electrode land 13c and an electrode land 13d respectively illustrated in FIGS. 5A and 5B by a via-hole electrode. Further, the electrode land 13d is electrically connected to a terminal electrode 13A illustrated in FIG. 6 by a via-hole electrode.

Figure 7:
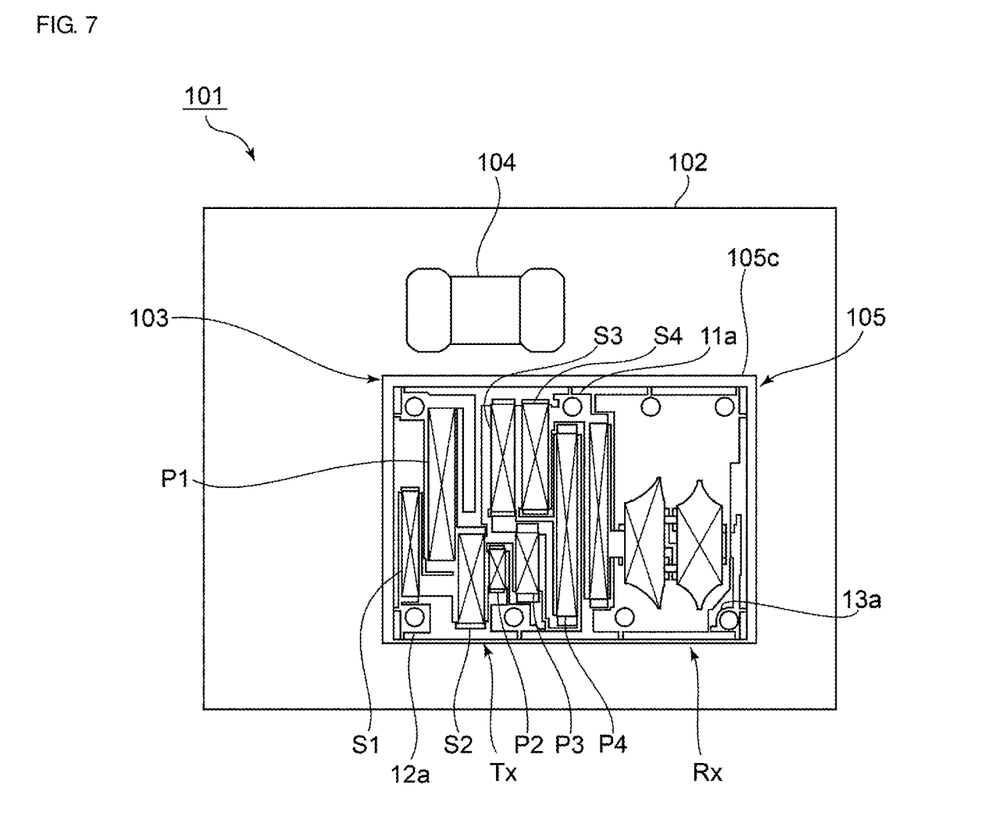
FIG. 7 is a plan view of a duplexer according to a comparative example.
Figure 8A:
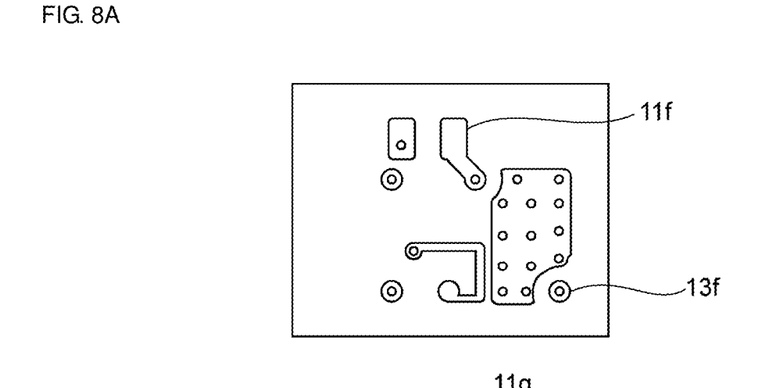
FIGS. 8A to 8D are respectively plan views of the structures of electrodes on the first, second, third, and fifth layers under the top surface of a module substrate of the duplexer according to the comparative example.
Figure 8B:
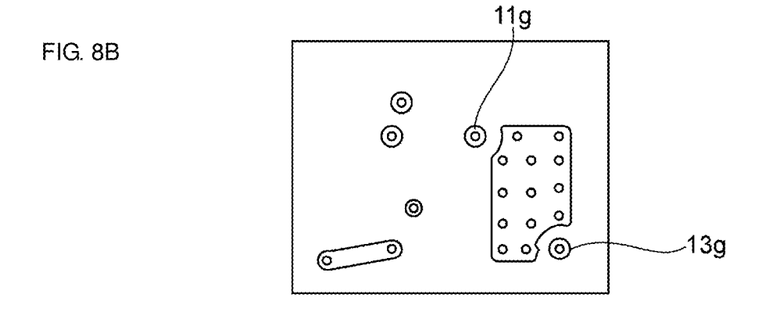
Figure 8C:
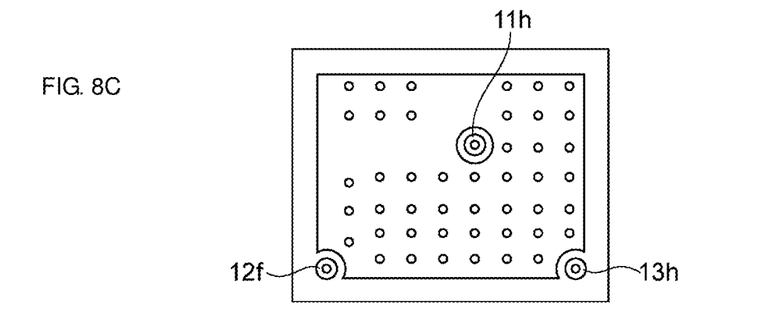
Figure 8D:
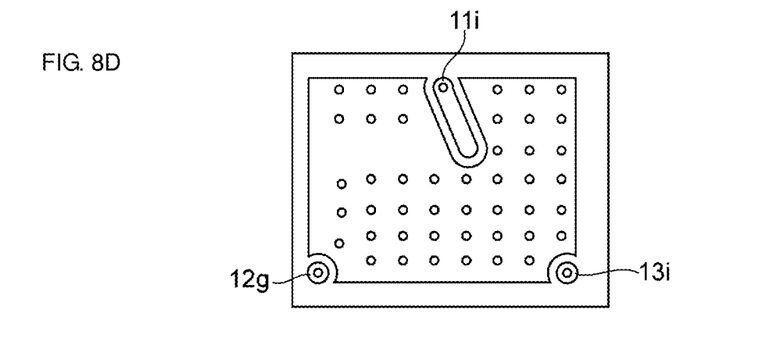
Figure 9:
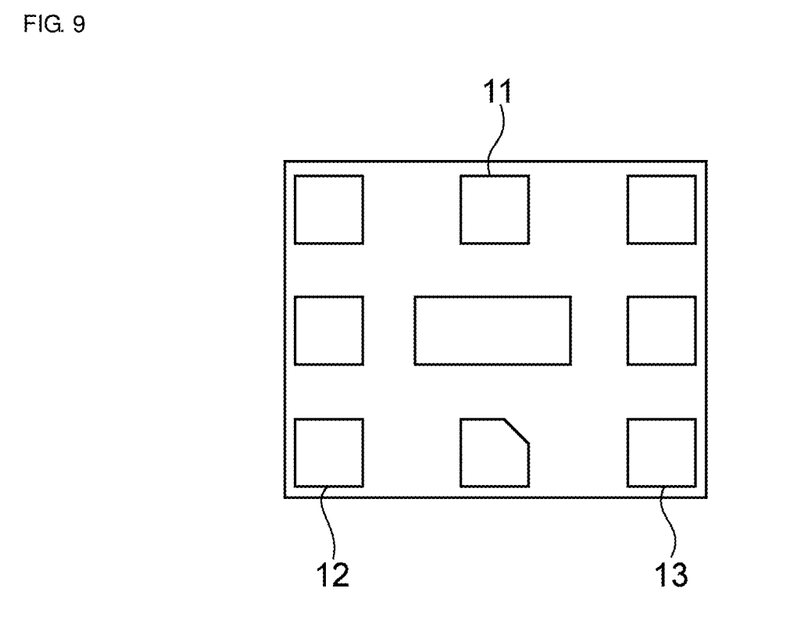
FIG. 9 is a schematic plan view of the structure of electrodes on the undersurface of the piezoelectric substrate of the duplexer according to the comparative example.

FIG. 7 is a plan view of a duplexer according to a comparative example. In a duplexer 101 according to the comparative example, a duplexer chip 103, and an inductance component 104, which is an external component, are mounted on a module substrate 102. The duplexer chip 103 is configured in the same or substantially the same manner as the duplexer chip according to the second preferred embodiment. It is to be noted, however, that the inductance component 104 is disposed outside a long side 105c of a piezoelectric substrate 105 with an oblong shape. That is, the distance between the inductance component 104 and the antenna terminal is shorter than the distance between the inductance component 104 and the transmitting terminal. FIGS. 8A to 8D are respectively schematic plan views of the electrode structures of the first layer, the second layer, the third and fourth layers, and the fifth layer under the top surface of the module substrate 102 of the duplexer 101 according to the comparative example. FIG. 9 is a schematic plan view of the electrode structure of the undersurface of the module substrate 102. Electrode lands 11f, 11g, 11h, and 11i respectively illustrated in FIGS. 8A to 8D are connected to each other by a via-hole electrode. The electrode land 11i is connected to the antenna terminal 11 illustrated in FIG. 9 by a via-hole electrode. Electrode lands 12f and 12g are electrically connected to each other by a via-hole electrode, and connected to the transmitting terminal 12 illustrated in FIG. 9. Further, electrode lands 13f to 13i are electrically connected to each other by a via-hole electrode. The electrode land 13i is connected to the receiving terminal 13 illustrated in FIG. 9.

Figure 10:
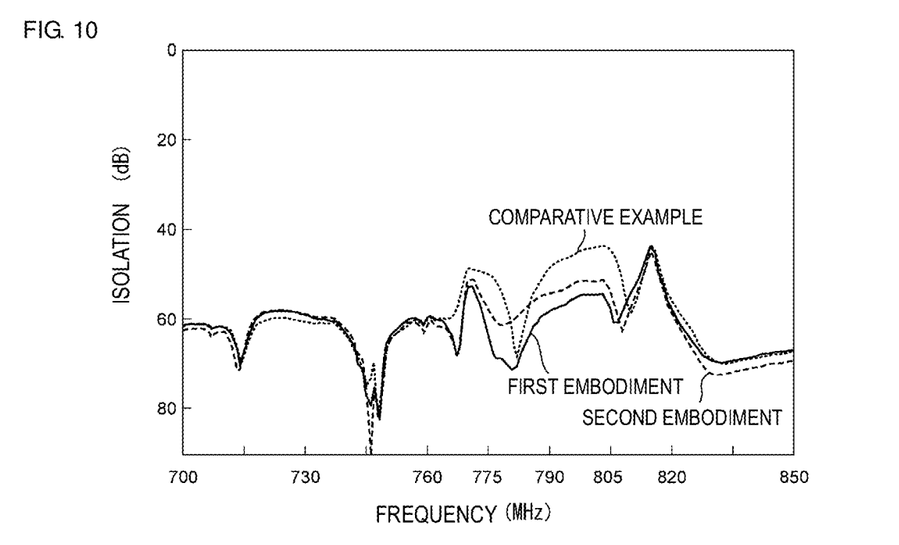
FIG. 10 illustrates the respective isolation characteristics of the first preferred embodiment of the present invention, the second preferred embodiment of the present invention, and the comparative example.

The duplexer 1 according to the first preferred embodiment was prepared in the same or similar manner as the duplexer 31 according to the second preferred embodiment. The duplexers 1, 31, and 101 are each preferably configured as a Band28B duplexer, for example. In this example, the pass band of the transmitting filter Tx is in the range of about 718 MHz to about 748 MHz, and the pass band of the receiving filter Rx is in the range of about 773 MHz to about 803 MHz. The isolation characteristics of the duplexers according to the first and second preferred embodiments, and the duplexer according to the comparative example were obtained. FIG. 10 illustrates the results.

It is appreciated from FIG. 10 that in comparison to the comparative example, the first and second preferred embodiments provide improved isolation in the frequency range of about 773 MHz to about 803 MHz, which is the pass band of the receiving filter Rx, for example. It is also appreciated that at the location of the frequency corresponding to the lowest isolation in the pass band of the receiving filter Rx, the comparative example exhibits an isolation of about 45.1 dB, whereas the first and second preferred embodiments exhibit significantly improved values of, for example, about 53.8 dB and about 51.1 dB, respectively. This is likely due to the superior electromagnetic coupling between the inductance component 4 and the transmitting-side shunt-arm resonator P1.

One of the unique features of preferred embodiments of the present invention is that, as described above, the duplexer including the transmitting filter Tx defined by a ladder elastic wave filter, and the receiving filter Rx is structured such that the inductance component 4, which is an external component, is disposed outside a side of the piezoelectric substrate 5 located near the transmitting-side shunt-arm resonator P1 so that the electromagnetic coupling between the inductance component 4 and the transmitting-side shunt-arm resonator P1 is stronger than the electromagnetic coupling between the inductance component 4 and the remaining shunt-arm resonators P2 to P4. Thus, there are no particular limitations as to the number of stages or circuit configuration in the transmitting filter Tx defined by a ladder elastic wave filter. Thus, the number of stages of shunt-arm resonators and series-arm resonators is not particularly limited. It is not necessarily required to connect an inductor between the transmitting-side shunt-arm resonator P1 and the ground potential, nor is it necessarily required to connect an inductor with a relatively large inductance value between the transmitting-side shunt-arm resonator P1 and the ground potential. In the related art, an antenna matching inductor is traditionally used as a matching circuit to provide matching between an antenna and a duplexer. Preferred embodiments of the present invention utilize electromagnetic coupling between an antenna matching inductor, and a transmitting-side shunt-arm resonator including an IDT electrode provided on a piezoelectric substrate that defines a portion of a ladder transmitting filter. The use of such electromagnetic coupling for duplexer applications makes it possible to provide a duplexer that not only provides matching between the antenna and the duplexer, but also improves the isolation between the transmitting filter and the receiving filter that has a passband at higher frequencies outside the pass band of the transmitting filter. Further, preferred embodiments of the present invention enable the use of a configuration in which no inductor is connected between the transmitting-side shunt-arm resonator P1 and the ground potential, or a configuration in which an inductor with a relatively small inductance value is connected between the transmitting-side shunt-arm resonator P1 and the ground potential. This effectively makes it possible to reduce the area of the inductor disposed in the duplexer.

Further, although a chip-type coil component is preferably used as the inductance component 4 in the preferred embodiments described above, other chip-type inductance components may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A duplexer comprising:
   a module substrate;
   an antenna terminal provided on the module substrate;
   a transmitting terminal provided on the module substrate;
   a receiving terminal provided on the module substrate;
   a transmitting filter connected between the antenna terminal and the transmitting terminal and including at least one elastic wave filter including a piezoelectric substrate that is mounted on the module substrate;
   a receiving filter connected between the antenna terminal and the receiving terminal; and
   an inductance component connected at one end to the antenna terminal, and connected at another end to a ground potential; wherein
   the inductance component is disposed outside the piezoelectric substrate and is mounted on the module substrate.

2. The duplexer according to claim 1, wherein the inductance component is disposed outside one side of the piezoelectric substrate such that a longitudinal direction of the inductance component extends parallel or substantially parallel to the one side.

3. The duplexer according to claim 1, wherein the inductance component includes a coil winding with an axial direction perpendicular or substantially perpendicular to a mounting surface of the inductance component.

4. The duplexer according to claim 1, wherein the receiving filter is provided on the piezoelectric substrate, and the piezoelectric substrate defines a duplexer chip.

5. The duplexer according to claim 1, wherein the module substrate is a multi-layer substrate.

6. The duplexer according to claim 1, wherein
   the piezoelectric substrate has a rectangular or substantially rectangular shape including a pair of short sides and a pair of long sides;
   the transmitting filter is positioned closer to a first short side of the pair of short sides than to a second short side of the pair of short sides; and
   the receiving filter is positioned adjacent to or near the second short side.

7. The duplexer according to claim 1, wherein the inductance component is a chip coil component.

8. The duplexer according to claim 1, wherein the transmitting filter includes a plurality of series-arm resonators.

9. The duplexer according to claim 6, wherein
   the antenna terminal is located in a middle portion of a first long side of the pair of long sides of the piezoelectric substrate;
   the transmitting terminal is positioned near a corner portion of the piezoelectric substrate between a second long side of the pair of long sides and the first short side; and
   the receiving terminal is located near a corner portion of the piezoelectric substrate between the second long side and the second short side.

10. The duplexer according to claim 2, wherein the one side of the piezoelectric substrate extends in a direction parallel or substantially parallel to a direction of propagation of an elastic wave in a transmitting-side shunt-arm resonator of the transmitting filter.

* * * * *